(12) United States Patent
Yagi et al.

(10) Patent No.: US 10,256,101 B2
(45) Date of Patent: Apr. 9, 2019

(54) RAW MATERIAL GAS SUPPLY APPARATUS, RAW MATERIAL GAS SUPPLY METHOD AND STORAGE MEDIUM

(71) Applicant: TOKYO ELECTRON LIMITED, Tokyo (JP)

(72) Inventors: Hironori Yagi, Yamanashi (JP); Kensaku Narushima, Yamanashi (JP); Atsunari Matsuyama, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 58 days.

(21) Appl. No.: 15/280,634

(22) Filed: Sep. 29, 2016

(65) Prior Publication Data

US 2017/0092549 A1 Mar. 30, 2017

(30) Foreign Application Priority Data

Sep. 30, 2015 (JP) .................................. 2015-194887
Dec. 10, 2015 (JP) .................................. 2015-241520

(51) Int. Cl.
| | |
|---|---|
| *C23C 16/00* | (2006.01) |
| *H01L 21/285* | (2006.01) |
| *C23C 16/455* | (2006.01) |
| *C23C 16/52* | (2006.01) |
| *H01L 21/02* | (2006.01) |
| *C23C 16/14* | (2006.01) |
| *C23C 16/448* | (2006.01) |

(52) U.S. Cl.
CPC ........ *H01L 21/28506* (2013.01); *C23C 16/14* (2013.01); *C23C 16/4481* (2013.01); *C23C 16/45544* (2013.01); *C23C 16/52* (2013.01); *H01L 21/0262* (2013.01); *H01L 21/02271* (2013.01)

(58) Field of Classification Search
CPC ................ C23C 16/14; C23C 16/4481; C23C 16/45544; C23C 16/54
See application file for complete search history.

(56) References Cited

U.S. PATENT DOCUMENTS

| | | | |
|---|---|---|---|
| 2014/0209021 A1 | 7/2014 | Inoue et al. | |
| 2014/0209022 A1* | 7/2014 | Inoue ..................... | G05D 16/00 118/712 |
| 2014/0299206 A1* | 10/2014 | Nagase ............... | C23C 16/4482 137/551 |

FOREIGN PATENT DOCUMENTS

| | | |
|---|---|---|
| JP | H05-305228 | 11/1993 |
| JP | 2014-145115 | 8/2014 |

(Continued)

*Primary Examiner* — Kelly M Gambetta

(57) ABSTRACT

In a raw material gas supply apparatus, a control unit obtains an offset value of (m3−(m1+m2)), m1, m2 and m3 being respective measurement values of first and second mass controllers, and a mass flow meter, by supplying a carrier gas and a dilution gas in a state where the carrier gas flows through a bypass channel. Further, the control unit obtains an actual measurement value of a flow rate of the raw material by subtracting the offset value from (m3−(m1+m2)) obtained by supplying the carrier gas and dilution gas in a state where the carrier gas flows through the inside of a raw material container and calculating a difference between a target value of the flow rate of the raw material and the actual measurement value, and adjusts a set value of the first mass flow controller such that the flow rate of the raw material becomes.

4 Claims, 12 Drawing Sheets

(56) References Cited

FOREIGN PATENT DOCUMENTS

KR  10-2014-0118893 A  10/2014
KR  10-2015-0058040 A   5/2015

* cited by examiner

FIG. 10

<PROCESSING RECIPE>

| STEP NUMBER | 1 | 2 | 3 | 4 | 5 | 6 | 7 | 8 | 9 |
|---|---|---|---|---|---|---|---|---|---|
| TIME(sec) | 50 | 20 | 0.4 | 0.3 | 20 | 0.4 | 0.3 | 7 | 0 |
| VALVE 1 | ON | ON | ON | OFF | ON | ON | OFF | ON | OFF |
| REPEATING STEP | 0 | 0 | 0 | 3 | 0 | 0 | 6 | 0 | 0 |
| NUMBER OF REPETITION | 0 | 0 | 0 | 40 | 0 | 0 | 30 | 0 | 0 |
| FLOW MODE | BYPASS | BYPASS | (AUTOFLOW) RAW MATERIAL CONTAINER | (AUTOFLOW) RAW MATERIAL CONTAINER | (AUTOFLOW) RAW MATERIAL CONTAINER | (AUTOFLOW) RAW MATERIAL CONTAINER | (AUTOFLOW) RAW MATERIAL CONTAINER | BYPASS | BYPASS |
| CARRIER $N_2$ (sccm) | 0 | 0 | 300 | 300 | 700 | 700 | 700 | 0 | 0 |
| OFFSET $N_2$ (sccm) | 0 | 0 | 1100 | 1100 | 600 | 600 | 600 | 0 | 0 |
| PRESSURE (Torr) | 0 | 80 | 80 | 80 | 40 | 40 | 40 | 40 | — |

FIG.11

<CALCULATION RECIPE FORMAT>

| STEP NUMBER | 1 | 2 | 3 | 4 | 5 | 6 | 7 | 8 | 9 |
|---|---|---|---|---|---|---|---|---|---|
| TIME(sec) | 0 | 20 | | | 20 | | | 0 | 0 |
| VALVE 1 | ON | ON | ON | OFF | ON | ON | OFF | ON | OFF |
| REPEATING STEP | 0 | 0 | 0 | | 0 | 0 | | 0 | 0 |
| NUMBER OF REPETITION | 0 | 0 | 0 | 10 | 0 | 0 | 10 | 0 | 0 |
| FLOW MODE | BYPASS | BYPASS | BYPASS | BYPASS | BYPASS | BYPASS | BYPASS | BYPASS | BYPASS |
| CARRIER $N_2$ (sccm) | 0 | 0 | | | | | | 0 | 0 |
| OFFSET $N_2$ (sccm) | 0 | 0 | | | | | | 0 | 0 |
| PRESSURE (Torr) | 0 | | | | | | | | – |

FIG. 12

<CALCULATION RECIPE>

| STEP NUMBER | 1 | 2 | 3 | 4 | 5 | 6 | 7 | 8 | 9 |
|---|---|---|---|---|---|---|---|---|---|
| TIME(sec) | 0 | 20 | 0.4 | 0.3 | 20 | 0.4 | 0.3 | 0 | 0 |
| VALVE 1 | ON | ON | ON | OFF | ON | ON | OFF | ON | OFF |
| REPEATING STEP | 0 | 0 | 0 | 3 | 0 | 0 | 6 | 0 | 0 |
| NUMBER OF REPETITION | 0 | 0 | 0 | 40 | 0 | 0 | 30 | 0 | 0 |
| FLOW MODE | BYPASS | BYPASS | BYPASS | BYPASS | BYPASS | BYPASS | BYPASS | BYPASS | BYPASS |
| CARRIER N$_2$ (sccm) | 0 | 0 | 300 | 300 | 700 | 700 | 700 | 0 | 0 |
| OFFSET N$_2$ (sccm) | 0 | 0 | 1100 | 1100 | 600 | 600 | 600 | 0 | 0 |
| PRESSURE (Torr) | 0 | 80 | 80 | 80 | 40 | 40 | 40 | 40 | — |

RAW MATERIAL GAS SUPPLY APPARATUS, RAW MATERIAL GAS SUPPLY METHOD AND STORAGE MEDIUM

CROSS-REFERENCE TO RELATED APPLICATIONS

This application claims priority to Japanese Patent Application Nos. 2015-194887 and 2015-241520 filed on Sep. 30 and Dec. 10, 2015, respectively, the entire contents of which is incorporated herein by reference.

FIELD OF THE INVENTION

The present disclosure relates to a technique for supplying a sublimated raw material together with a carrier gas to a film forming unit.

BACKGROUND OF THE INVENTION

A film forming process, one of the semiconductor manufacturing processes, is performed by ALD (Atomic Layer Deposition) in which a raw material gas and a reactant gas for oxidizing, nitriding or reducing the raw material gas are alternately supplied, CVD (Chemical Vapor Deposition) in which a raw material gas is decomposed in a vapor phase or made to react with a reactant gas, or the like. As for the raw material gas used in the film forming process, a sublimated gas of the raw material is used in order to extremely reduce the amount of impurities introduced into a substrate and increase a density of crystal after film formation. For example, the raw material gas is used for a film forming apparatus for forming a high dielectric film by ALD.

In such a film forming apparatus, a raw material gas is obtained by vaporizing (sublimating) a raw material by heating a raw material container in which a solid or liquid raw material is accommodated. A carrier gas is supplied into the raw material container, and the raw material is supplied into a processing chamber by the carrier gas. The raw material gas is combination of the carrier gas and a gaseous raw material. In controlling a thickness, a quality or the like of a film formed on a semiconductor wafer (hereinafter, referred to as "wafer"), it is required to accurately control an amount of the vaporized raw material (flow rate of the raw material contained in the raw material gas).

However, the amount of the vaporized raw material in the raw material container is changed by the filling amount of the raw material. When the raw material is in a solid state, the amount of the vaporized raw material is varied by non-uniform distribution of the raw material in the raw material container or by the change in the grain size or the like. Further, when the raw material is in a solid state, the temperature of the raw material container is decreased by loss of heat caused by sublimation (referred to as "vaporization" in this specification) of the raw material. Since, however, convection does not occur in the raw material container in which the solid raw material is accommodated, the distribution of the temperature in the raw material container tends to be non-uniform. Therefore, the vaporized amount of the raw material tends to be unstable.

Recently, along with the trend toward miniaturization of a wiring pattern formed on a wafer, there is required a method capable of stabilizing a film thickness or a film quality. Although the ALD method is advantageous in that a raw material gas can be supplied within a short period of time, there is still a need for a method capable of controlling a raw material supply amount to a set value.

Japanese Patent Application Publication No. 1993-305228 discloses a technique for detecting and controlling a total mass flow of a non-evaporated gas in a system to a constant level in the case of supplying a carrier gas to a liquid raw material evaporation unit and introducing a buffer gas into the system. In that case, however, differences between the flow rate meters are not considered.

In a raw material gas supply apparatus disclosed in Japanese Patent Application Publication No. 2014-145115, since a mass flow meter is calibrated by a flow rate of a carrier gas, in a state that the flow rate of the carrier gas is set to a set value by a mass flow controller, the difference between the set value of the flow rate of the carrier gas and the flow rate measured by the mass flow meter indicates the amount of the sublimated raw material in the case where the set value of the flow rate of the carrier gas is zero. Japanese Patent Application Publication No. 2014-145115 discloses a technique for obtaining an amount of the sublimated raw material gas by multiplying the difference between the set value of the flow rate of the carrier gas and the flow rate measured by the mass flow meter by a proportional coefficient. However, the object of the present disclosure is not solved by such a technique.

SUMMARY OF THE INVENTION

In view of the above, the present disclosure provides a technique for stabilizing a supply amount of a sublimated raw material in the case of supplying a raw material gas containing a gas obtained by sublimating a solid or liquid raw material to a film forming unit.

In accordance with an aspect, there is provided a raw material gas supply apparatus for supplying a raw material gas obtained by vaporizing a solid or liquid raw material in a raw material container along with a carrier gas to a film forming unit for performing a film forming process on a substrate through a raw material gas supply line, the apparatus including:

a carrier gas supply line for supplying a carrier gas to the raw material container;

a bypass channel branched from the carrier gas supply line and connected to the raw material gas supply line while bypassing the raw material container;

a dilution gas supply line connected to the raw material gas supply line at a downstream side of a connection portion to which the bypass channel is connected, the dilution gas supply line serving to allow a dilution gas to join with the raw material gas;

a first mass flow controller and a second mass flow controller connected to the carrier gas supply line and the dilution gas supply line, respectively;

a mass flow meter provided in the raw material gas supply line at a downstream side of a joining portion to which the dilution gas supply line is connected;

a switching mechanism configured to selectively allow a carrier gas to flow through an inside of the raw material container or through the bypass channel; and a control unit configured to execute: a first step of obtaining an offset value that is a value of (m3−(m1+m2)), m1, m2 and m3 being respective measurement values of the first mass controller, the second mass flow controller and the mass flow meter, by supplying the carrier gas and the dilution gas in a state where the carrier gas flows through the bypass channel; a second step of obtaining an actual measurement value of a flow rate of the raw material by subtracting the offset value from a value of (m3−(m1+m2)) obtained by supplying the carrier gas and dilution gas in a state where the carrier gas flows through the inside of the raw material container and calculating a difference between a target value of the flow rate of the raw material and the actual measurement value; and a third step of adjusting a set value of the first mass flow controller such that the flow rate of the raw material becomes the target value based on relationship between the difference, increase/decrease in the flow rate of the raw material, and increase/decrease in the flow rate of the carrier gas.

In accordance with another aspect, there is provided a raw material gas supply method for supplying a raw material gas obtained by vaporizing a solid or liquid raw material in a raw material container along with a carrier gas to a film forming unit for forming a film on a substrate by using a raw material gas supply apparatus including: a carrier gas supply line for supplying a carrier gas to the raw material container; a bypass channel branched from the carrier gas supply line and connected to the raw material gas supply line while bypassing the raw material container; a dilution gas supply line connected to the raw material gas supply line at a downstream side of a connection portion to which the bypass channel is connected, the dilution gas supply line serving to allow a dilution gas to join with the raw material gas; a first mass flow controller and a second mass flow controller connected to the carrier gas supply line and the dilution gas supply line, respectively; a mass flow meter provided in the raw material gas supply line at a downstream side of a joining portion to which the dilution gas supply line is connected; and a switching mechanism configured to selectively allow a carrier gas to flow through an inside of the raw material container or through the bypass channel, the method including:

obtaining an offset value that is a value of (m3−(m1+m2)), m1, m2 and m3 being respective measurement values of the first mass controller, the second mass flow controller and the mass flow meter, by supplying the carrier gas and the dilution gas in a state where the carrier gas flows through the bypass channel;

obtaining an actual measurement value of a flow rate of the raw material by subtracting the offset value from a value of (m3−(m1+m2)) obtained by supplying the carrier gas and dilution gas in a state where the carrier gas flows through the inside of the raw material container and calculating a difference between a target value of the flow rate of the raw material and the actual measurement value; and adjusting a set value of the first mass flow controller such that the flow rate of the raw material becomes the target value based on relationship between the difference, increase/decrease in the flow rate of the raw material, and increase/decrease in the flow rate of the carrier gas.

In accordance with still another aspect, there is provided a storage medium storing a computer program used for a raw material gas supply apparatus for vaporizing a solid or liquid raw material in a raw material container and supplying the vaporized raw material, as a raw material gas, along with a carrier gas to a substrate through a raw material gas supply line, wherein the computer program has a group of steps for performing the raw material gas supply method described above.

BRIEF DESCRIPTION OF THE DRAWINGS

The objects and features of the present disclosure will become apparent from the following description of embodiments, given in conjunction with the accompanying drawings, in which:

FIG. 10 is a view for explaining a processing recipe;

FIG. 11 is a view for explaining a recipe calculation format;

FIG. 12 is a view for explaining a calculation recipe;

DETAILED DESCRIPTION OF THE EMBODIMENTS

Figure 1:
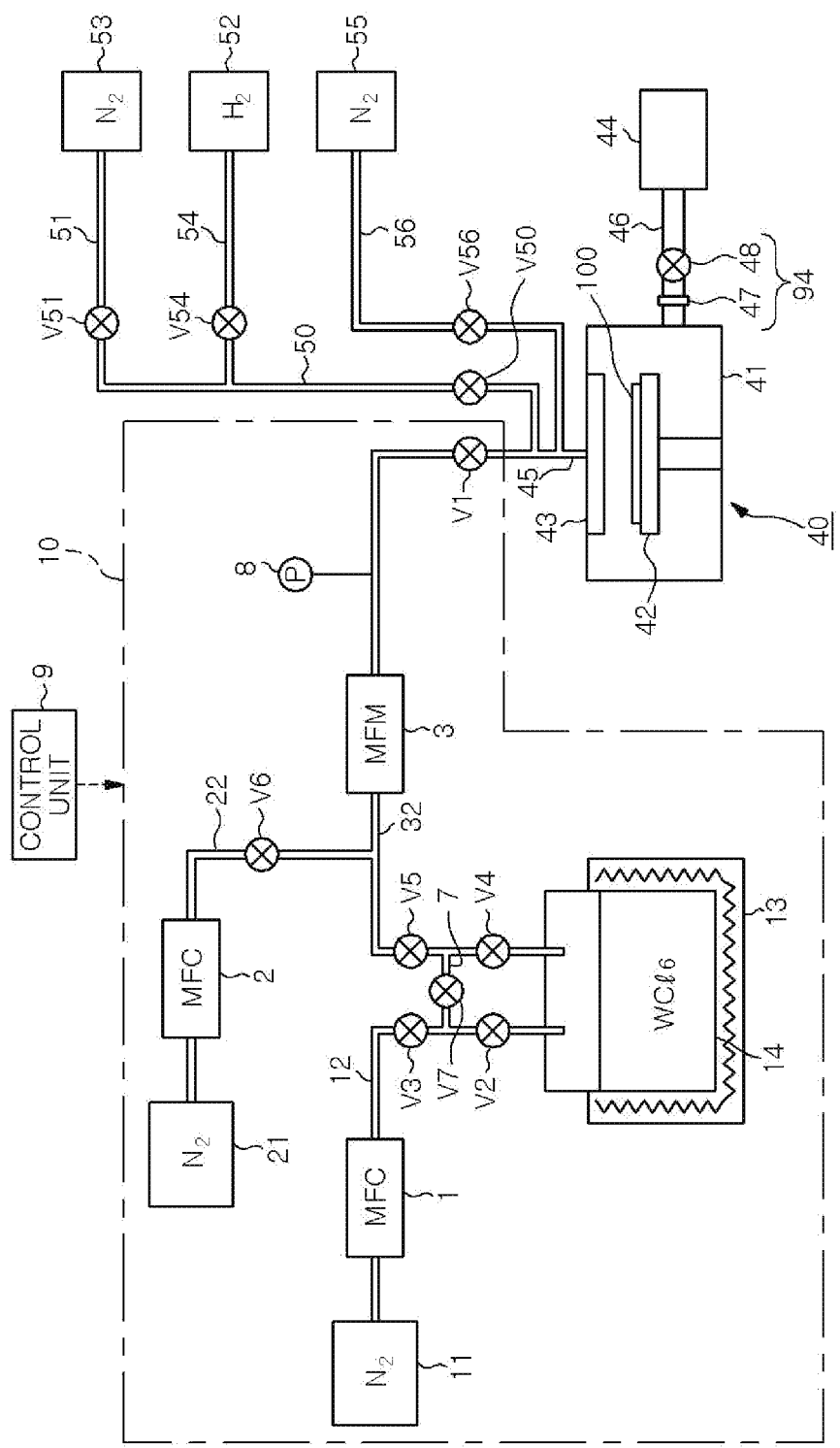
FIG. 1 shows an overall configuration of a film forming apparatus to which a raw material gas supply apparatus is applied.

Hereinafter, an exemplary configuration in which a raw material gas supply apparatus of the present disclosure is applied to a film forming apparatus will be described. As shown in FIG. 1, a film forming apparatus includes: a film forming unit 40 for forming a film on a wafer 100 as a substrate by using an ALD method; and a raw material gas supply unit 10 including a raw material gas supply device for supplying a raw material gas to the film forming unit 40. In this specification, it is assumed that a gas including a carrier gas and a (sublimated) raw material flowing along with the carrier gas is referred to as a raw material gas.

A raw material gas supply unit 10 includes a raw material container 14 accommodating $WCl_6$ as a raw material. The raw material container 14 contains $WCl_6$ in a solid state at a room temperature. The raw material container 14 is covered by a jacket-shaped heating unit 13 having a resistance heating element. The raw material container 14 is configured to control a temperature in the raw material container 14 by increasing/decreasing the amount of power supplied from a power supply (not shown) based on a temperature of a gas phase part in the raw material container 14 which is detected by a temperature detector (not shown). A temperature of the heating unit 13 is set to a level, e.g., 160° C., at which the solid raw material is sublimated and $WCl_6$ is not decomposed.

Inserted into the gas phase part above the solid raw material in the raw material container 14 are a downstream end portion of a carrier gas supply line 12 and an upstream end portion of a raw material gas supply line 32. A carrier gas supply source 11 for supplying a carrier gas, e.g., $N_2$ gas, is provided at the upstream end of the carrier gas supply line 12. A first mass flow controller (MFC) 1, a valve V3, and a valve V2 are installed in the carrier gas supply line 12 in that order from the upstream side.

A valve V4, a valve V5, a mass flow meter (MFM) 3 that is a flow rate measuring unit, and a valve V1 are installed in the raw material gas supply line 32 in that order from the upstream side. Reference numeral 8 in the drawing denotes a pressure gauge for measuring a pressure of a gas supplied from the raw material gas supply line 32. A downstream end portion of the raw material gas supply line 32 is referred to as a gas supply line 45 because a reactant gas or a replacement gas to be described later flows therein. A downstream end of the dilution gas supply line 22 for supplying a dilution gas joins with the upstream side of the MFM 3 in the raw material gas supply line 32. A dilution gas supply source 21 for supplying a dilution gas, e.g., $N_2$ gas, is provided at an upstream end of the dilution gas supply line 22. A second mass flow controller (MFC) 2 and a valve V6 are installed in the dilution gas supply line 22 in that order from the upstream side. A portion between the valves V2 and V3 in the carrier gas supply line 12 and a portion between the valves V4 and V5 in the raw material gas supply line 32 are connected by a bypass channel 7 having a valve V7. The valves V2, V4 and V7 correspond to a switching mechanism.

Next, the film forming unit 40 will be described. The film forming unit 40 includes a mounting table 42 for horizontally supporting a wafer W in, e.g., a vacuum chamber 41, and a gas inlet 43 for introducing a raw material gas or the like into the vacuum chamber 41. The mounting table 42 has a heater (not shown). A gas supply line 45 is connected to the gas inlet 43. A gas from the raw material gas supply unit 10 is supplied into the vacuum chamber 41 through the gas inlet. A vacuum exhaust unit 44 is connected to the vacuum chamber 41 via a gas exhaust line 46. Pressure control valves 47 and 48 constituting a pressure control unit 94 for controlling a pressure in the film forming unit 40 are provided in the gas exhaust line 46. The gas supply line 45 joins with a reactant gas supply line 50 for supplying a reactant gas that reacts with a raw material gas and a replacement gas supply line 56 for supplying a replacement gas. The other end of the reactant gas supply line 50 is branched into an $H_2$ gas supply line 54 connected to a reactant gas supply source 52 for supplying a reactant gas, e.g., $H_2$ gas, and an inert gas supply line 51 connected to an inert gas supply source 53 for supplying an inert gas, e.g., $N_2$ gas. The other end of the replacement gas supply line 56 is connected to a replacement gas supply source 55 for supplying a replacement gas, e.g., $N_2$ gas. Notations V50, V51, V54 and V56 in the drawing denote valves installed in the reactant gas supply line 50, the inert gas supply line 51, the $H_2$ gas supply line 54, and the replacement gas supply line 56, respectively.

As will be described alter, when a W (tungsten) film is formed by the film forming unit 40, a raw material gas containing $WCl_6$ and $H_2$ gas as a reactant gas are alternately supplied and a replacement gas for replacing an atmosphere in the vacuum chamber 41 is supplied between the supply of the raw material gas and the reactant gas. The raw material gas is intermittently supplied to the film forming unit 40 while alternately repeating a supply period and a pause period. The supply of the raw material gas is controlled by controlling on/off of the valve V1. The valve V1 is configured to be opened/closed by a control unit 9 to be described later. "ON" indicates an open state of the valve V1. "OFF" indicates a closed state of the valve V1.

Figure 2:
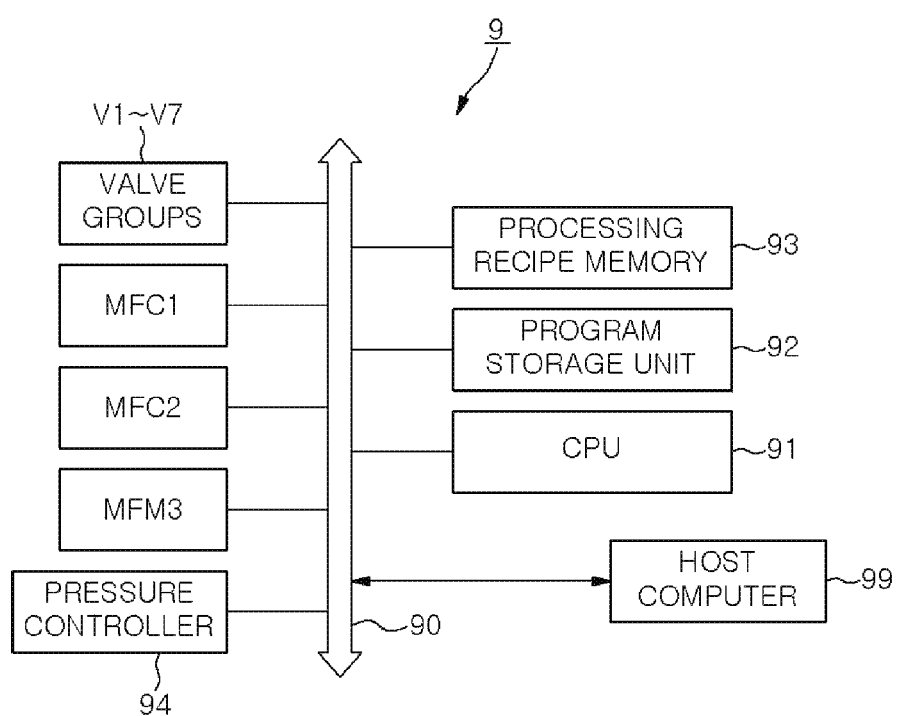
FIG. 2 shows a configuration of a controller of a raw material gas supply unit according to an embodiment.

The raw material gas supply unit 10 includes the control unit 9. As shown in FIG. 2, the control unit 9 includes a CPU 91, a program storage unit 92, and a memory 93 for storing a processing recipe of a film forming process performed on the wafer 100. Reference numeral 90 in the drawing denotes a bus. The control unit 9 is connected to a pressure control unit 94 connected to the valve groups V1 to V7, the MFC 1, the MFC 2, the MFM 3, and the film forming unit 40. The control unit 9 is also connected to a host computer 99. A film forming recipe of a lot of the wafer 100 to be loaded into the film forming apparatus is transmitted from the host computer 99 and stored in the memory 93.

The processing recipe is information on a processing condition and a sequence of film formation of the wafer 100 which is set for each lot. The processing condition includes a process pressure, timing of supplying a gas to the film forming unit 40 and timing of stopping the supply in the ALD method, a raw material gas flow rate, and the like. Hereinafter, the ALD method will be briefly described. First, $WCl_6$ gas as a raw material gas is supplied for, e.g., one second and then the valve V1 is closed to allow $WCl_6$ gas to be adsorbed onto the surface of the wafer 100. Next, a replacement gas ($N_2$ gas) is supplied into the vacuum chamber to replace the atmosphere in the vacuum chamber 41. Thereafter, a reactant gas ($H_2$ gas) is supplied together with a dilution gas ($N_2$ gas) into the vacuum chamber 41. As a consequence, a W (tungsten) film of an atomic layer is formed on the surface of the wafer 100 by hydrolysis and dechlorination reaction. Then, the replacement gas is supplied into the vacuum chamber 41 to replace an atmosphere in the vacuum chamber 41. Accordingly, a cycle of sequentially supplying the raw material gas containing $WCl_6$, the replacement gas, the reactant gas and the replacement gas into the vacuum chamber 41 is repeated multiple times. As a result, a W film is formed.

In the ALD method, the cycle of sequentially supplying the raw material gas, the replacement gas, the reactant gas, and the replacement gas is repeated multiple times. Therefore, the timing of an ON signal and the timing of an OFF signal are determined by the recipe that specifies such a cycle. For example, the supply and the supply stop of the raw material gas are performed by the valve V1. Accordingly, a period from the ON signal to the OFF signal of the valve V1 corresponds to a raw material gas supply period and a period from the OFF signal to the ON signal of the valve V1 corresponds to a period in which the raw material gas supply is stopped. When the ALD method is used for obtaining measured flow rates of the raw material in the MFCs 1 and 2 and the MFM 3, the measured flow rates may be unstable due to the intermittent supply of the raw material gas for a short supply period. To that end, in this example, a value obtained by dividing an integration value of the measurement values of the MFCs 1 and 2 and the MFM 3 in one cycle of ON and OFF of the valve V1 by the time period of one cycle is used (evaluated) as a measurement output value (measured value), as will be described in detail later.

The memory 93 stores therein information, e.g., a relational equation, indicating a relationship between increase/decrease in a flow rate of the carrier gas at a heating temperature of the raw material container 14, e.g., 160° C., and increase/decrease in a flow rate of a vaporized raw material supplied to the raw material gas supply line 32 together with the carrier gas. This relational equation is approximated as a linear expression as shown in the following Eq. (1).

Increase/decrease in flow rate of vaporized raw material=k(constant)×increase/decrease in flow rate of carrier gas   Eq. (1)

The program stored in the program storage unit 92 has a group of steps for executing the operation of the raw material gas supply unit 10. The term "program" includes software such as a process recipe or the like. The group of steps includes a step of integrating measurement outputs of the flow rates of the MFCs 1 and 2 and the MFM 3 in the supply period and performing an operation while using the integration value as the flow rate in the supply period. The integration process may be performed by a hard configuration using a time constant circuit. The program is stored in a storage medium, e.g., a hard disk, a compact disk, a magnet optical disk, a memory card, or the like and installed in a computer.

The operation of the film forming apparatus according to the embodiment will be described with reference to the flow chart shown in FIG. 3. In this case, one lot includes two or more wafers 100, e.g., 25 wafers 100. First, the power of the film forming apparatus is ON and, then, a carrier accommodating a wafer 100 of a leading lot (the first lot processed after the power of the film forming apparatus is ON) is loaded onto a carrier stage. In this case, the steps 1, 2 and 4 are executed in that order, and an offset value is obtained under the condition of the processing recipe of the leading lot.

Figure 4:
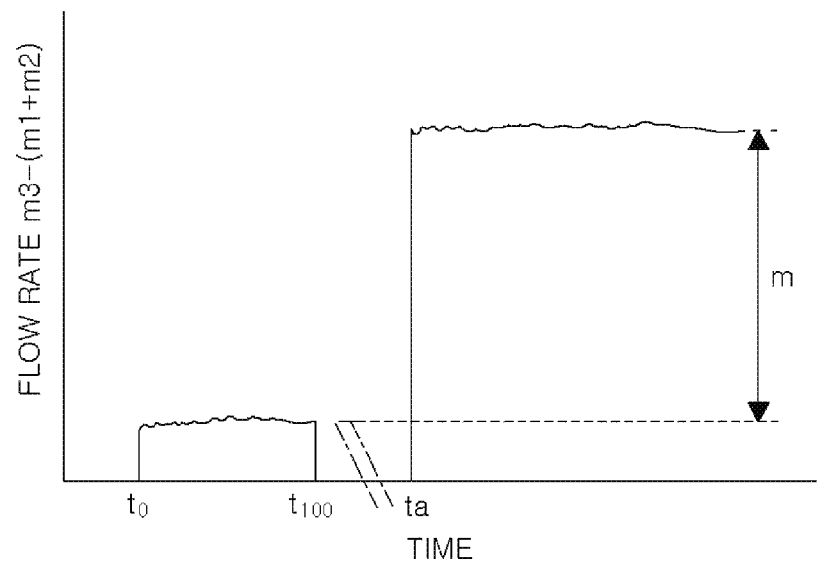
FIG. 4 is a characteristic diagram showing a difference between a measurement value of a mass flow meter (MFM) and a total set value of a first and a second mass flow controller (MFC)

Hereinafter, the offset value will be described. FIG. 4 shows a difference between a sum (m1+m2) of the measurement value m1 of the MFC 1 and the measurement value m2 of the MFC 2 and a measurement value m3 of the MFM 3 in the case of supplying a carrier gas and a dilution gas respectively from the carrier gas supply source 11 and the dilution gas supply source 21 by using the raw material gas supply unit 10 to the film forming unit 40 through the MFM 3. The difference (m3−(m1+m2)) obtained during a period from time $t_0$ to $t_{100}$ indicates a value obtained in the case of supplying the carrier gas to the raw material gas supply line 32 through the bypass channel 7 without passing through the raw material container 14. During the period from the time $t_0$ to the time $t_{100}$, the gas flowing through the MFM 3 is combination of the carrier gas supplied from the carrier gas supply line 12 and the dilution gas supplied from the dilution gas supply line 22. However, the difference between the measurement value m3 of the MFM 3 and the sum (m1+m2) of the measurement value m1 of the MFC 1 and the measurement value m2 of the MFC 2 is not zero as shown in FIG. 4. Such a difference caused by individual differences among the MFM 3, the MFC 1, and the MFC 2 corresponds to an offset value.

Next, the process of obtaining the offset value will be described. The offset value is obtained by setting the set values of the MFCs 1 and 2 to the respective flow rates of the carrier gas and the dilution gas which are determined based on the target value of the raw material gas flow rate stored in the processing recipe. The timing of opening/closing the valve V1 is set to be the same as that in the cycle of supplying the raw material gas to the film forming unit 40 and stopping the supply in the processing recipe. A pressure in the process of obtaining the offset value is set to a level determined by the processing recipe.

The set value of the MFC 1 is determined based on the flow rate of the carrier gas which enables the raw material to be supplied at a target flow rate in a state the raw material container 14 is filled with the solid raw material at a maximum level. The relationship between the increase/decrease in the flow rate of the raw material and the increase/decrease in the flow rate of the carrier gas is stored in, e.g., the memory 93. The pressure in the film forming unit 40 is set to a set pressure in the processing recipe by the pressure control unit 94. The control of the temperature of the film forming unit 40 requires time and the vaporized raw material may be adhered to a low-temperature portion and solidified. Therefore, the temperature of the film forming unit 40 is set in advance to a film forming temperature, e.g., 170° C.

When the flow rate of the raw material is small and the total flow rate of the raw material gas diluted by the dilution gas is determined as the total flow rate of the carrier gas and the dilution gas, a set value of the flow rate of the dilution gas is obtained by subtracting the set value of the flow rate of the carrier gas from the total flow rate. When the flow rate of the raw material is included in the total flow rate, the target value of the supply amount of the raw material is considered as, e.g., a weight per unit time. Therefore, the total flow rate and the flow rate of the carrier gas for supplying the raw material are obtained based on the target value of the supply amount of the raw material and the processing pressure. Accordingly, the set value of the flow rate of the dilution gas is obtained by subtracting the sum of the supply amount of the raw material and the flow rate of the carrier gas from the total flow rate.

Next, the valves V3, V5, V6 and V7 are opened and the valve V1 is opened/closed at the same timing as opening/closing timing of the valve V1 in the processing recipe after the time $t_0$. In this case, an operation of opening the valve V1 for one second and closing the valve V1 for one second is repeated 100 times from time $t_0$ to $t_{100}$. The vacuum chamber 41 has already been vacuum-evacuated. Accordingly, the carrier gas flows at a flow rate corresponding to the set value of the MFC 1 from the carrier gas supply source 11 to the raw material gas supply line 32 through the carrier gas supply line 12 and the bypass channel 7 (bypass flow). In the raw material gas supply line 32, the carrier gas is mixed with the dilution gas supplied from the dilution gas supply line 22, and the raw material gas diluted with the dilution gas flows through the MFM 3. The gaseous mixture of the carrier gas and the dilution gas is intermittently supplied to the film forming unit 40.

Figure 5:
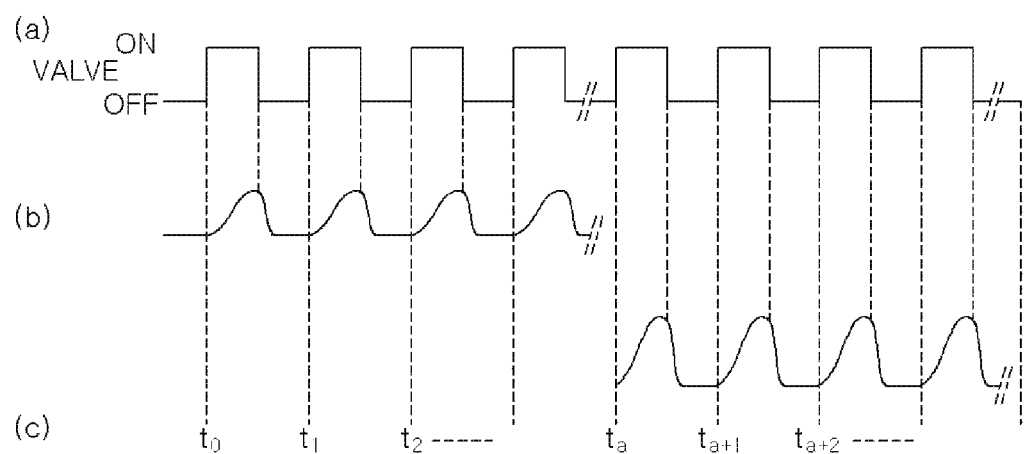
FIG. 5 depicts time charts showing opening/closing of a valve and temporal changes in a flow rate of a raw material supplied from the raw material supply unit.

The measurement values of the flow rates in the MFCs 1 and 2 and the MFM 3 during the period from the time $t_0$ to the time $t_{100}$ are obtained. In FIG. 5, (a) shows a state of the valve V1 for supplying the raw material gas and blocking the supply of the raw material gas. The ON period corresponds to the raw material gas supply period. The OFF period corresponds to a period in which the raw material gas supply is stopped. In FIG. 5, (b) shows variation of a measurement output (measured value) of the flow rate of the raw material gas which is measured by the MFM 3 during the period from the time $t_0$ to the time $t_{100}$. Since the opening period of the valve V1 is short, the measurement output of the flow rate of the raw material gas which is measured by the MFM 3 abruptly increases after the ON instruction of the valve V1 and abruptly decreases after the OFF instruction of the valve V1. A ratio of the supply period and the supply-stop period in (a) of FIG. 5 is merely an example for convenience of illustration.

Therefore, the measurement value of the flow rate is obtained by dividing, by a time period T of one cycle of supplying the raw material gas and stopping the supply, an integration value obtained by integrating the measured outputs of the flow rates of the MFM 3 and the MFCs 1 and 2 during one cycle by the control unit 9. In this case, based on the ON instruction of the valve V1 shown in (a) of FIG. 5, the integration operation of the gas flow rate is started at the time $t_0$ and completed at the time $t_1$ at which the next ON instruction of the valve V1 is outputted. The period from the time $t_0$ to the time $t_1$ is set to one cycle.

Further, values (integration value/$(t_1-t_0)$) obtained by dividing the integration value of the flow rates in the MFCs 1 and 2 and the MFM 3 from the time $t_0$ to the time $t_1$ by the time period T of one cycle, i.e., the period $(t_1-t_0)$ from the time $t_0$ to the time $t_1$, are respectively set to the measurement values m1, m2 and m3 of the MFC 1, the MFC 2 and the MFM 3 from the time $t_0$ to the time $t_1$.

Figure 6:
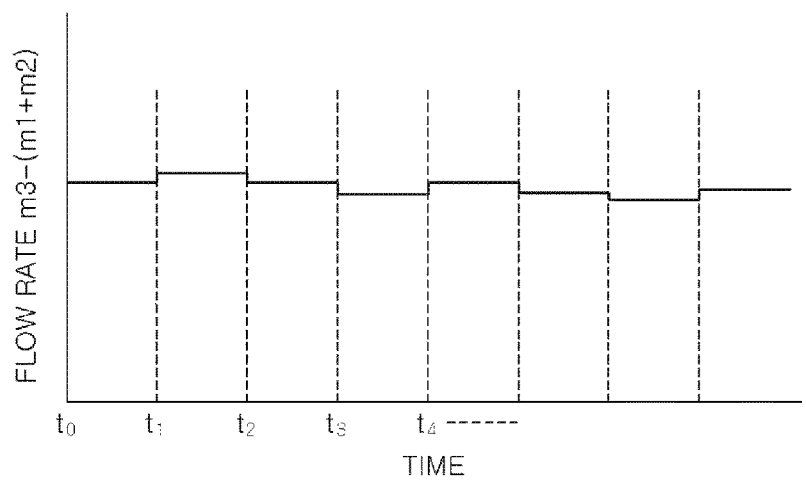
FIG. 6 is a characteristics diagram showing an example of a measurement value of MFM.

The values of m1 to m3 in the respective cycles from time $t_0$ to time $t_1$, from time $t_1$ to time $t_2$ . . . are obtained and the value of (m3−(m1+m2)) in each cycle is obtained as shown in FIG. 6. The average of the values of (m3−(m1+m2)) during 100 cycles from the time $t_0$ is set to the offset value.

Referring back to FIG. 3, when the offset value obtained in the step S4 is within a tolerable range, "YES" is selected in a step S5 and the processing proceeds to a step S6. A first wafer 100 is loaded into the film forming unit 40 and processed, so that an actual measurement value m of the flow rate of the raw material is obtained. The offset value indicates the difference between the MFM 3, and the MFC 1 and the MFC 2. When the difference is too large, it is considered that there is a reason other than the measurement differences between the MFM 3, and the MFC 1 and the MFC 2. Therefore, the tolerance range of the difference that may be considered as individual variations of the MFM 3, the MFC 1 and the MFC 2 is determined in advance.

In the step S6, the raw material container 14 is heated to, e.g., 160° C., by the heating unit 13 of the raw material container 14. Accordingly, the solid raw material is sublimated and the concentration of the raw material in the raw material container 14 is increased to a level close to a saturated concentration. Then, the wafer 100 is loaded into the film forming unit 40 and the actual measurement value m of the flow rate of the raw material which will be described later is obtained. In other words, the flow rate of the carrier gas and the flow rate of the dilution gas are set to levels stored in the processing recipe and the pressure of the film forming unit 40 is set to a level determined by the processing recipe. At time $t_a$, the valve V7 is closed and the valves V2 and V4 are opened. Accordingly, the carrier gas is supplied at a flow rate set by the MFC 1 from the carrier gas supply line 12 into the raw material container 14 and the raw material vaporized in the raw material container 14 flows together with the carrier gas to the raw material gas supply line 32. Also, the dilution gas flowing from the dilution gas supply line 22 to the raw material gas supply line 32 joins therewith. After the time $t_a$, the valve V1 is opened/closed at the same timing as the opening/closing timing of the valve V1 in the processing recipe. In this example, the operation of opening the valve V1 for one second and closing the valve V1 for one second is repeated. Thus, the raw material gas mixed with the dilution gas is sent to the film forming unit (autoflow). Accordingly, the carrier gas is supplied to the raw material container 14 and the raw material gas is supplied to the film forming unit 40 while setting the flow rate of the carrier gas, the flow rate of the dilution gas, the pressure of the film forming unit 40 and the interval of opening/closing the valve V1 to those in the process of obtaining the offset value.

As a consequence, as shown in (c) of FIG. 5, the measurement value of the raw material gas abruptly increases after the ON instruction of the valve V1 up to a level higher than the measurement value from the time $t_0$ to the time $t_{100}$ and immediately decreases after the OFF instruction of the valve V1.

In the processing of the first wafer 100, as in the period from the time $t_0$ to the time $t_{100}$, the integration values of the flow rates in the MFCs 1 and 2 and the MFM 3 from the time $t_a$ to the time $t_{a+1}$ are divided by the time period T of one cycle, i.e., the period $(t_{a+1}-t_a)$ from the time $t_a$ to the time $t_{a+1}$. The values thus obtained, i.e., (integration value/$(t_{a+1}-t_a)$), are respectively set to the measurement values m1, m2 and m3 of the MFCs 1 and 2 and the MFM 3 from the time $t_a$ to the time $t_{a+1}$. The value of (m3−(m1+m2)) in each cycle is obtained by subtracting the sum of the measurement value m1 of the MFC 1 and the measurement value m2 of the MFC 2 from the measurement value m3 of the MFM 3 in each cycle of the gas supply. The value of (m3−(m1+m2)) in each cycle after the time $t_a$ corresponds to the flow rate of the raw material obtained by subtracting the sum of the flow rate of the carrier gas and the flow rate of the dilution gas from the total flow rate of the raw material gas diluted by the dilution gas and supplied to the film forming unit 40, as shown in FIG. 4.

However, as described above, there is a difference between the measurement value of the MFM 3 and the sum of the measurement value m1 of the MFC 1 and the measurement value m2 of the MFC 2, which is caused by the difference in the measurement outputs of the MFM 3 and the MFCs 1 and 2. The value corresponding to the difference is the offset value. Therefore, an actual measurement value m of the flow rate of the raw material supplied to the film forming unit 40 is obtained by obtaining the average of the values (m3−(m1+m2)) in the respective cycles of the raw material gas supply after the time $t_a$ shown in FIGS. 4 and 5 and then subtracting the offset value during the period from the time $t_0$ to the time $t_{100}$ from the average. The actual measurement value m is converted to a value of the raw material (mg/min) by the following Eq. (2).

Raw material(mg/min)=Flow rate(sccm)of Raw material×0.2(Conversion Factor)/22400×(Molecular weight (WCl$_6$:396.6)of Raw material 1)×1000    Eq. (2)

Then, in a step S7, N is set to 2 and the processing proceeds to a step S8. When the actual measurement value m of the flow rate of the raw material is within the set range, "YES" is selected in the step S8 and the processing proceeds to a step S9. In the step S9, the same processing performed on the first wafer 100 is performed on a second (N=2) wafer 100, and the actual measurement value m of the flow rate of the raw material is obtained.

On the other hand, when the actual measurement value m of the flow rate of the raw material in an (N-1)$^{th}$ wafer, i.e., the first wafer 100 in this case, is not within the range (set range), "NO" is selected and the processing proceeds to a step S21. Next, when the actual measurement value m of the flow rate of the raw material is not a value determined as an error (abnormal value), the processing proceeds to a step S22.

Figure 7:
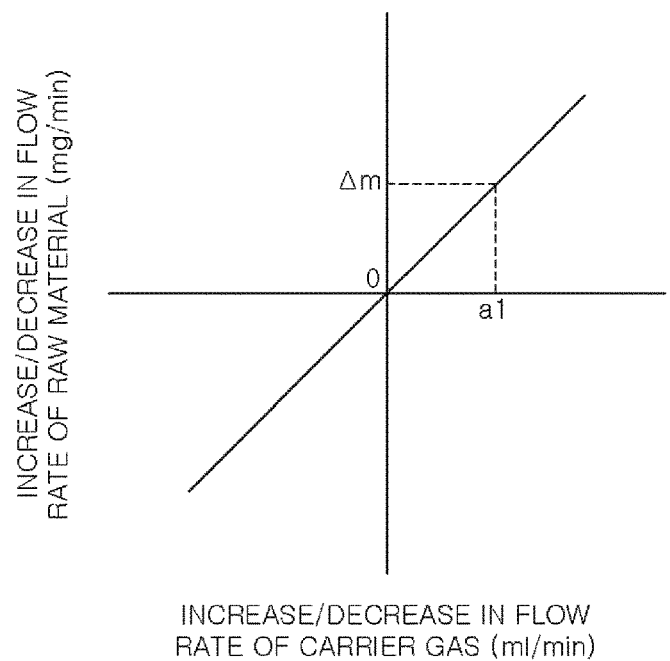
FIG. 7 is a characteristic diagram showing increase/decrease in a flow rate of a carrier gas and increase/decrease in the flow rate of the raw material.

In the step S22, the flow rate of the raw material is controlled by controlling the flow rate of the carrier gas. As described above, the increase/decrease a1 in the flow rate of the carrier gas and the increase/decrease Δm in the flow rate of the raw material flowing together with the carrier gas are approximated as a linear expression y=k(x) as shown in FIG. 7 on the assumption that y indicates the increase/decrease in the flow rate of the raw material and x indicates the increase/decrease in the flow rate of the carrier gas. Accordingly, the measured value of the flow rate of the raw material is in proportion to the measured value m1 of the MFC 1. Since the difference between the actual measurement value m of the flow rate of the raw material and the target value of the flow rate of the raw material may be set to the increase/decrease Δm in the flow rate of the raw material, the equation Δm=k×a1 is satisfied and a1 can be calculated. a1 thus calculated is added to the current measurement value of the MFC 1. It is possible to set the measurement value of the MFC 1 becomes to (m1+a1) by adding a1 to the current set value of the MFC 1 since the MFC 1 is controlled such that the set value of the flow rate becomes the measurement value. By adding a1 to the measurement value of the MFC 1, the total flow rate of the raw material gas diluted by the dilution gas which is supplied to the film forming unit 40 is increased and, thus, the pressure is changed. Therefore, a1 is subtracted from the current set value of the MFC 2 so that the value obtained by subtracting a1 from the current measurement value m2 of the MFC 2, i.e., (m2−a1), becomes the measurement value. Then, the process proceeds to a step S9 and an actual measurement value m of the flow rate of the raw material by processing an $N^{th}$ wafer 100 is obtained.

Thereafter, the process proceeds to a step S10. Since the second wafer 100 is not the last wafer 100, "NO" is selected. In a step S11, N is set to 3 and the process returns to the step S8. In the step S8, it is determined whether or not the actual measurement value m of the flow rate of the raw material in the film forming process of an $(N-1)^{th}$ wafer 100, i.e., the second wafer 100 in this case, is within the set range. When the actual measurement value m of the flow rate of the raw material is within the set range, the process proceeds to the step S9 and an actual measurement value m of the flow rate of the raw material for processing the third wafer 100 is obtained by using the set value of the flow rate of the carrier gas in the processing of the second wafer 100. When the actual measurement value m of the flow rate of the raw material in the second wafer 100 is not within the set range, the flow rate of the carrier gas is controlled in the steps S21 and S22 and the third wafer 100 is processed. By repeating the steps S8 to S11, all wafers of the lot are sequentially processed.

Figure 8:
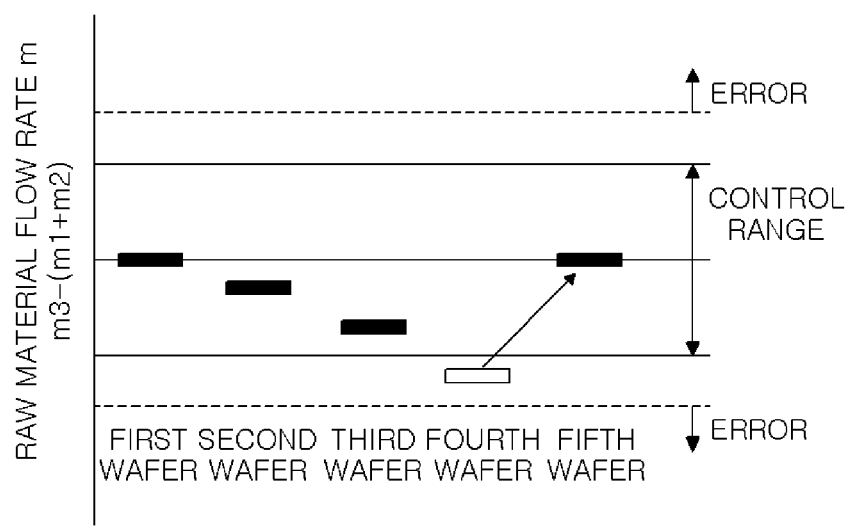
FIG. 8 explains an actual measurement value of a flow rate of a raw material in a film forming process for each wafer.

FIG. 8 shows an example of the actual measurement value m of the flow rate of the raw material for each wafer 100 as described above. For example, when the actual measurement value m of the flow rate of the raw material in the film forming process for the fourth wafer 100 is not within the set range in the step S9, the steps S10 and S11 are executed. After N is updated to 5, the process proceeds to the step S8. Since the actual measurement value m of the flow rate of the raw material in the film forming process of the fourth wafer 100 is not within the set range, the process proceeds to the step S21. Next, when the actual measurement value m of the flow rate of the raw material is not a value determined as an error (abnormal value) as shown in FIG. 8, the process proceeds to the step S22 to control the flow rate of the raw material by controlling the flow rate of the carrier gas.

The wafers 100 are processed in the above-described manner. In the case of the final wafer 100, i.e., the $25^{th}$ wafer in this example, "YES" is selected in the step S10 and the process is completed.

Next, a subsequent lot will be described. When the subsequent lot is loaded onto the carrier stage, the step S1 and S2 are executed. Since the current lot is not the leading lot, "NO" is selected in the step S2 and the process proceeds to a step S3. In the step S3, it is determined whether or not the processing recipe for the wafer 100 of the current lot is different from the processing recipe for the wafer of the prior lot (previous lot). Specifically, it is determined whether the flow rate of the raw material (target value of the flow rate of the raw material) in the processing recipe, the set pressure of the film forming unit 40, and the cycle of supplying the raw material gas and stopping the supply in the film forming process are the same as those in the previous processing recipe. When any one of them is different, "YES" is selected and the process proceeds to the step S4. In the step S4, the target value of the flow rate of the raw material, the set pressure of the film forming unit 40, and the cycle of supplying the raw material gas and stopping the supply in the film forming process are set based on the processing recipe for the wafer 100 of the current lot (subsequent lot). The offset value is obtained as in the case of the previous lot and the process proceeds to the step S5. When the offset value is within the tolerable range, the process proceeds to the step S6 and the step S6 and the subsequent steps are executed.

When the processing recipe in the subsequent lot, e.g., the flow rate of the raw material (target value of the flow rate of the raw material) in the processing recipe, the set pressure of the film forming unit 40, and the cycle of supplying the raw material gas and stopping the supply in the film forming process, is the same as the processing recipe in the prior lot (previous lot), "NO" is selected in the step S3 and the process proceeds to the step S6. The step S6 and subsequent steps are executed by using the offset value used in the previous lot.

When the offset value obtained based on the processing recipe of the lot is not within the tolerable range, "NO" is selected in the step S5 and the processing proceeds to a step S30. After an alarm is activated in the step S30, the processing is completed. In this case, any error may be caused due to a factor other than the individual variations of the MFM 3, the MFC 1 and the MFC 2 and, thus, a maintenance is performed.

When the actual measurement value m of the flow rate of the raw material in the $N^{th}$ wafer 100 is not within the set range and is a value determined as an error (abnormal value) in the step S8, the process proceeds from the step S8 to the step S21 and "YES" is selected in the step S21. Therefore, the process proceeds to the step S30 and the alarm is activated. After the process is completed, the maintenance of the raw material gas supply unit 10 is performed.

In the above embodiment, the flow rate of the carrier gas is controlled based on the difference between the target value and the actual measurement value of the flow rate of the raw material in the case of supplying the carrier gas to the raw material container 14, discharging the vaporized raw material together with the carrier gas from the raw material container 14, diluting the vaporized raw material with the dilution gas, and supplying the vaporized raw material diluted with the dilution gas to the film forming unit 40. The actual measurement value of the flow rate of the raw material is obtained by subtracting the offset value corresponding to the individual variation of the respective measurement devices from the difference between the sum of the measurement values of the flow rates of the carrier gas and the dilution gas and the sum of the measurement values of the flow rates of the vaporized raw material, the carrier gas and the dilution gas. Therefore, the individual differences among the respective measurement devices are cancelled out and the accurate actual measurement value of the flow rate of the raw material can be obtained. Since the supply amount of the carrier gas is controlled based on the actual measurement value, the supply amount of the raw material for each wafer 100 becomes stable.

When the ALD method is performed, the integration value of the measurement output in one cycle of supplying the raw material gas and stopping the supply in each measurement device is considered as the measurement value of the flow rate. Therefore, the instability of the measurement caused by increase/decrease in the gas flow rate during a short period of time can be prevented. Accordingly, the measurement value of the gas flow rate can be stably obtained. As a result, the supply amount of the raw material gas for each wafer 100 becomes stable.

In measuring the actual measurement value of the flow rate of the raw material in the steps S6 to S10, the actual measurement value m of the flow rate of the raw material may be measured before the processing of the wafer 100 of a lot. For example, the actual measurement value m of the flow rate of the raw material may be measured by performing dummy processing performed by supplying the raw material gas without loading the wafer 100 into the vacuum chamber 41 under the same condition as that of the processing recipe in the corresponding lot. Accordingly, the accuracy of the flow rate of the raw material gas in the processing of the first wafer 100 can be increased.

For example, a pre-coating process of controlling a condition of the vacuum chamber 41 by supplying a film forming gas to the vacuum chamber 41 and depositing a film on an inner surface of the vacuum chamber 41 is performed before the processing of a lot in the film forming apparatus or after the cleaning of the vacuum chamber 41. The actual measurement value m of the flow rate of the raw material may be measured in this pre-coating process.

The measurement values m1 to m3 of the flow rates may be calculated by dividing, by a time period nT of n cycles, an integration value obtained by integrating measurement outputs of the flow rates of the MFM 3 and the MFCs 1 and 2 during n (n being 2 or more) cycles of supplying the raw material gas and stopping the supply by the control unit 9.

In order to satisfy the condition of the pre-coating process, it is preferable to ensure a high accuracy of the flow rate of the raw material gas supplied to the vacuum chamber 41. The accuracy of the flow rate of the raw material gas can be increased by performing the dummy processing before the pre-coating process and measuring the actual measurement value m of the flow rate of the raw material. For example, the actual measurement value m of the flow rate of the raw material is obtained by the dummy processing as in the step S6 shown in FIG. 3. Then, it is determined whether or not the actual measurement value m of the flow rate of the raw material is within the set range (step S8). When the actual measurement value m of the flow rate of the raw material is not within the set range, the pre-coating process may be performed after the flow rate of the carrier gas is adjusted.

The actual measurement value m of the flow rate of the raw material may be obtained by, e.g., the integration value in one cycle of supplying the raw material and stopping the supply, and the supply amount of the raw material may be controlled in real time during the film forming process of one wafer 100. For example, the variation is obtained by performing a PID operation by using the difference between the target value of the flow rate of the raw material and the actual measurement value m of the flow rate of the raw material which is obtained in the cycle T1 of supplying the raw material and stopping the supply at a certain time. The supply amount of the raw material in a next cycle, of the cycle T, of supplying the raw material and stopping the supply may be controlled based on the variation.

The present disclosure may be used for a film forming apparatus by using a CVD method. In the CVD method, a film is formed on the wafer 100 by continuously supplying a raw material gas to the film forming unit 40 and also by continuously supplying a reactant gas. In the CVD method, the measurement outputs of the flow rates of the MFM 3 and the MFCs 1 and 2 in a state where the flow rate of the raw material gas is stable may be respectively set to the measurement values m1 to m3 of the MFM 3 and the MFCs 1 and 2.

Further, in the CVD method, the actual measurement value m of the flow rate of the raw material is measured at an interval of, e.g., 0.1 sec, in the raw material supply period in processing of one wafer 100. When the actual measurement value m of the flow rate of the raw material at a certain time is not within the set range, the actual measurement value m of the flow rate of the raw material may be immediately controlled to be within the set range.

Since the flow rate of the raw material is controlled in real time, it is not required to obtain the actual measurement value m of the flow rate of the raw material by the processing of the first wafer 100 and the dummy processing.

The raw material accommodated in the raw material container 14 is not limited to a solid raw material and may be a liquid raw material. When the flow rate of the carrier gas is controlled in the step S22, the flow rates of the carrier gas which respectively correspond to the actual measurement value and the target value of the flow rate of the raw material are obtained using a function, e.g., a linear expression, in which the flow rate of the carrier gas is made to correspond to the flow rate of the raw material and, then, the flow rate of the carrier gas may be controlled based on the difference between the flow rates of the carrier gas.

Further, a tank for temporally storing the raw material gas at the upstream side of the valve V1 may be provided at the downstream side of the MFM 3. In this case, the raw material gas stored in the tank can be supplied at once to the film forming unit 40, so that the flow rate of the raw material supplied to the film forming unit per unit time can be increased. Accordingly, the opening period of the valve V1 can be shortened, which makes it possible to shorten the processing time of the wafer 100.

When the wafer 100 is processed by the ALD method, a plurality of films having different film qualities is consecutively formed. Thus, a plurality of ALDs different from each other in at least one of the flow rate of the raw material and the supply period of the raw material gas (supply period of the raw material gas in one cycle) may be performed. For example, the film forming process performed on the wafer 100 includes first ALD and second ALD. The first ALD and the second ALD are performed under different conditions of the flow rate of the raw material and the supply period of the raw material gas. For example, in the case of performing a film forming process by executing a cycle of supplying the raw material and stopping the supply 100 times, there may be used a processing recipe in which the supply period of the raw material gas and the flow rate of the raw material in 50 cycles of the first ALD are different from the supply period of the raw material gas and the flow rate of the raw material in 50 cycles of the second ALD. In that case, the offset value in the first ALD and the offset value in the second ALD are obtained in the process of obtaining the offset value of the step S4 shown in FIG. 3.

Figure 3:
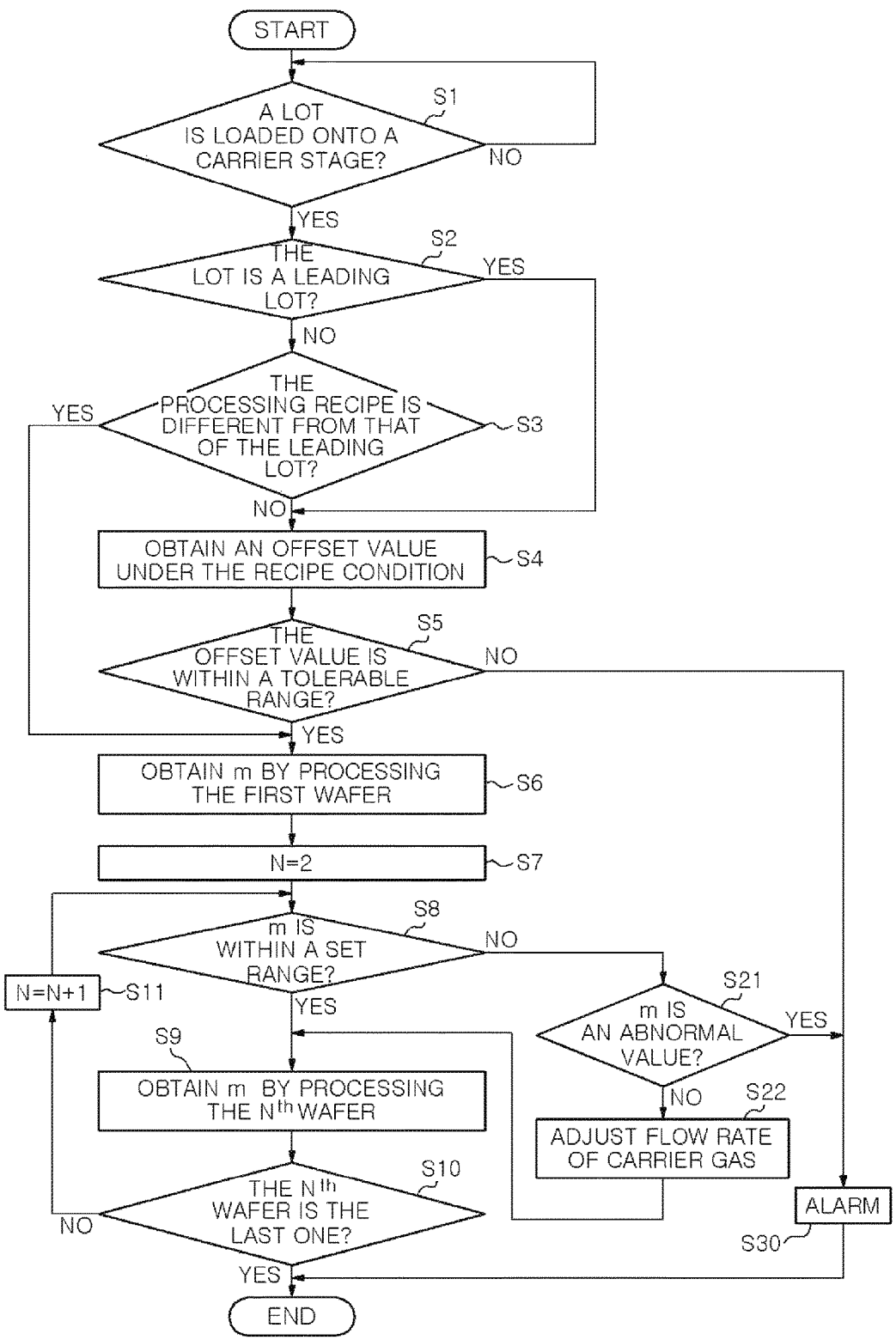
FIG. 3 is a flow chart showing a process of controlling a supply amount of a raw material in the raw material gas supply unit.

In the step S6 shown in FIG. 3, the actual measurement value m of the flow rate of the raw material supplied from the raw material container 14 is obtained by using the offset value of the first ALD in the film forming process using the first ALD and by using the offset value of the second ALD in the film forming process using the second ALD.

Further, the steps S8, S21 and S22 shown in FIG. 3 may be applied to the respective actual measurement values m.

When the offset value is obtained in the step S4 shown in FIG. 3, a recipe including a calculation parameter in which a process parameter that greatly affects the offset value is selected from the processing recipe may be used.

Figure 9:
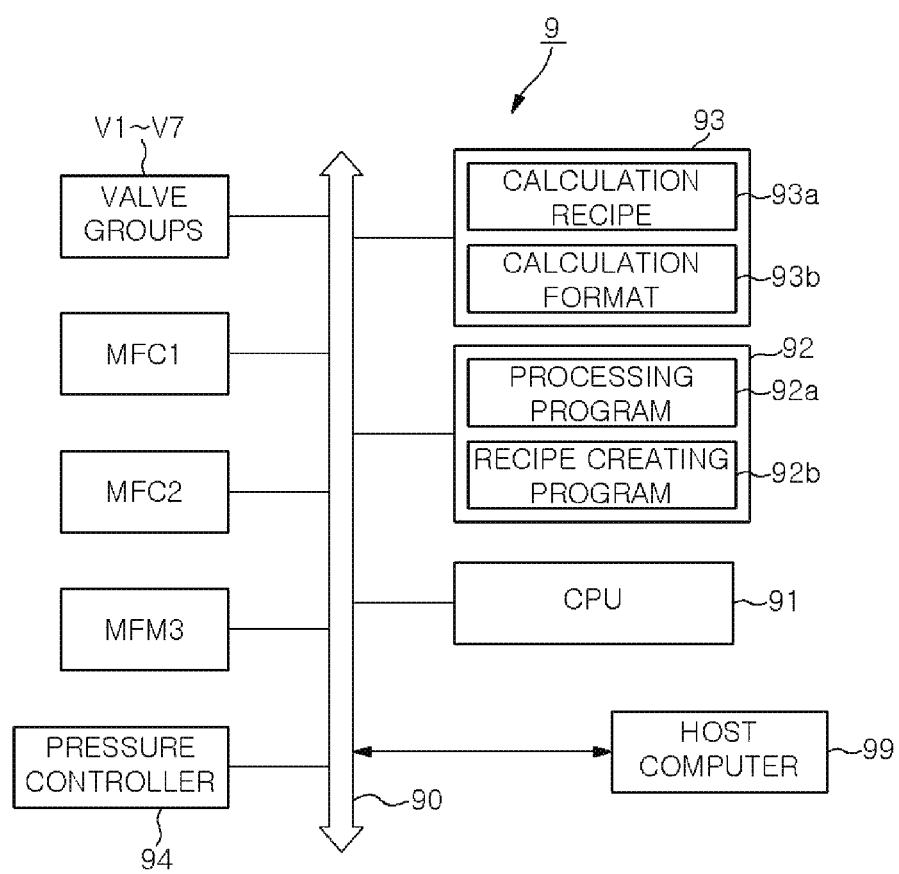
FIG. 9 shows a configuration of a controller of a raw material gas supply unit according to another embodiment.

For example, as shown in FIG. 9, the memory 93 of the control unit 9 stores a calculation recipe 93*a* and a calculation recipe format 93*b* as a pattern for creating the calculation recipe 93*a*. The program storage unit 92 stores therein a processing program 92*a* for performing the operation of the raw material gas supply unit 10 which is shown in the flowchart of FIG. 3 and a recipe creating program 92*b* for creating the calculation recipe 93*a*.

The processing recipe will be described before the description of the calculation recipe format 93*b*. The processing recipe specifies the sequence of the process performed on the wafer 100 of each lot. FIG. 10 schematically shows an example of the actual processing recipe. The processing recipe shown in FIG. 10 includes "step number" indicating an execution sequence, "execution time" of each step, "on/off of the valve V1", "repeating step" and "the number of repetition" indicating a step number to be executed after the completion of the corresponding step, "flow mode" indicating switching between bypass flow and autoflow by the manipulation of the valves V2, V4 and V7, "carrier N$_2$" indicating a carrier gas flow rate (sccm), "offset N$_2$" indicating a dilution gas flow rate (sccm), and "pressure (Torr)" of the film forming unit 40. "Bypass flow" indicates a method of supplying the carrier gas to the raw material gas supply line 32 through the bypass channel 7 while bypassing the raw material container 14 and supplying a gaseous mixture of the carrier gas and the dilution gas to the film forming unit 40. "Autoflow" indicate a method of supplying the carrier gas to the raw material container 14, supplying the carrier gas containing the vaporized raw material to the raw material gas supply line 32, and supplying the raw material gas to the film forming unit 40. The processing recipe shown in FIG. 10 includes a part for supply of the raw material gas of a film forming recipe for the wafer 100, and a part for supply and supply-stop of the replacement gas and the reactant gas is omitted.

The following is description on the operation based on the processing recipe shown in FIG. 10. The wafer 100 is loaded into the vacuum chamber 41 and waits for 50 seconds. In the step 2, the pressure of the film forming unit 40 is controlled to 80 Torr. Next, the flow rate of the carrier gas is set to 300 sccm and the flow rate of the dilution gas is set to 1100 sccm. The operation of opening the valve V1 for 0.4 sec and closing the valve V1 for 0.3 sec is repeated 40 times. Then, the pressure of the film forming unit 40 is controlled to 40 Torr. The flow rate of the carrier gas is set to 700 sccm and the flow rate of the dilution gas is set to 600 sccm. The operation of opening the valve V1 for 0.4 sec and closing the valve V1 for 0.3 sec is repeated 30 times. Thereafter, the supply of the raw material to the film forming unit 40 is stopped and the vacuum chamber 41 is evacuated to a predetermined vacuum level. In other words, in the processing recipe, the first ALD shown in the steps 3 and 4 and the second ALD shown in the steps 6 and 7 are performed on the wafer 100.

Next, the calculation recipe format 93*b* will be described. As in the case of the processing recipe, the calculation recipe format 93*b* includes "step number", "execution time", "on/off of the valve V1", "repeating step", "the number of repetition", "flow mode", "carrier N$_2$" indicating a flow rate (sccm) of the carrier gas, "offset N$_2$" indicating a flow rate (sccm) of the dilution gas, and "pressure (Torr)" of the film forming unit 40, as shown in FIG. 11. In the calculation recipe format 93*b*, parameters that affect the acquisition of the offset value are blank and parameters that do not affect the acquisition of the offset value are common as those of the processing recipe. For example, in the calculation recipe format 93*b*, "execution time" in the steps 3 and 4 and the steps 6 and 7, "carrier N$_2$" and "offset N$_2$" in the steps 3 to 7, "pressure" in the steps 2 to 8 are blank. The values corresponding thereto can be recorded for each processing recipe. In addition, "flow mode" in the steps 1 to 9 is set to the bypass flow, and the number of repetition in the steps 4 and 7 is set to 10.

In the calculation recipe 92*a*, the flow mode and the number of repetition of opening/closing of the valve V1 are different from those of the processing recipe. This is because actual supply of the raw material is not required. In the processing recipe, the film forming process is performed by repeating the opening/closing of the valve V1 100 times. However, the difference in the number of repetition of the opening/closing of the valve V1 does not affect the offset value. Therefore, the time required to obtain the offset value is shortened by reducing the number of repetition of the opening/closing of the valve V1. Although it is not included in the recipes shown in FIGS. 10 to 12, a small amount of the raw material gas remaining in the raw material gas supply line 32 may be supplied to the film forming unit 40 and, thus, the reactant gas is not supplied.

Next, the recipe creating program 92*b* will be described. When the process proceeds to the step S4 shown in FIG. 3, the processing recipe corresponding to the current lot shown in FIG. 10 is sent from the host computer to the memory 93 of the control unit. The recipe creating program 92*b* reads out from the processing recipe the items corresponding to the blank portions of the calculation recipe format 93*b*, i.e., values of "carrier N$_2$" and "offset N$_2$" in the steps 3 to 7, "pressure" of the film forming unit 40 in the steps 2 to 8, and "execution time" in the steps 3 and 4 and in the steps 6 and 7. The read-out values are recorded in the blank portions of the calculation recipe format 93*b* shown in FIG. 11. Accordingly, the calculation recipe 93*a* shown in FIG. 12 is created and stored in the memory 93.

The offset value is obtained by using the calculation recipe 93*a* created by the recipe creating program 92*b*. As will be described in the following verification test, the offset value is affected by the flow rates of the carrier gas and the dilution gas and also by the temperature of the film forming unit 40. Further, the offset value is affected by the pressure of the film forming unit 40 and by the opening/closing cycle of the valve V1 even if the flow rate of the carrier gas is constant. When the offset value is obtained, the temperature is not considered because the temperature of the film forming unit 40 is already set to the film forming temperature.

Therefore, an accurate offset value for each processing recipe can be obtained by setting the calculation recipe 92*a* in which the opening/closing time of the valve V1, the flow rates of the carrier gas and the dilution gas, and the set value of the pressure of the film forming unit 40 are recorded for each processing recipe. Accordingly, the accuracy of the actual measurement value of the flow rate of the raw material which is obtained by subtracting the offset value from the measurement value of the flow rate of the raw material is increased. In addition, since the calculation recipe 92a is used as described above, the load of data processing is decreased.

In the case of consecutively performing the film forming process on the wafers 100 of each lot under the same processing recipe, as the wafers 100 are processed, the remaining amount of the raw material in the raw material container 14 is decreased. When the flow rates of the carrier gas and the dilution gas are controlled in the steps S21 and S22 shown in FIG. 3, the temperature of the raw material gas is changed due to the difference in the temperature between the carrier gas and the dilution gas and, thus, the offset value may be gradually deviated. To that end, the offset value may be changed when the number of processed wafers 100 reaches a predetermined number or when the supply time of the raw material gas reaches a predetermined time. For example, when a next lot is processed after completion of the processing of the current lot, there may be provided a step in which "YES" is selected and the processing proceeds to the step S4 when the number of processed wafers 100 reaches the predetermined number after the step S2 in FIG. 3 and "NO" is selected and the process to proceed to the step S3 when the number of processed wafers 100 does not reach the predetermined number. Accordingly, the offset value is corrected even when the individual deviations of the MFM 3, the MFC 1 and the MFC 2 are increased due to the increase in the number of processed wafers or in the processing time in the case of consecutively performing the same processing recipe. Hence, the actual measurement value m of the flow rate of the raw material can be obtained with high accuracy. The offset value may also be obtained by stopping the processing of a lot during the processing of the lot.

For example, when the effect of the offset value on the pressure of the film forming unit 40 is small, the offset value may be obtained by allowing the gas to flow from the raw material gas supply line 32 through a bypass line that bypasses the film forming unit 40.

[Verification Test]

The following test was executed to verify the relationship between the processing recipe and the offset value. The offset value was obtained by using the film forming apparatus according to the embodiment by using different processing recipes in which the pressure and the temperature of the film forming unit 40, the cycle of supplying the raw material gas and stopping the supply, and the flow rates of the carrier gas and the dilution gas are varied.

Figure 13:
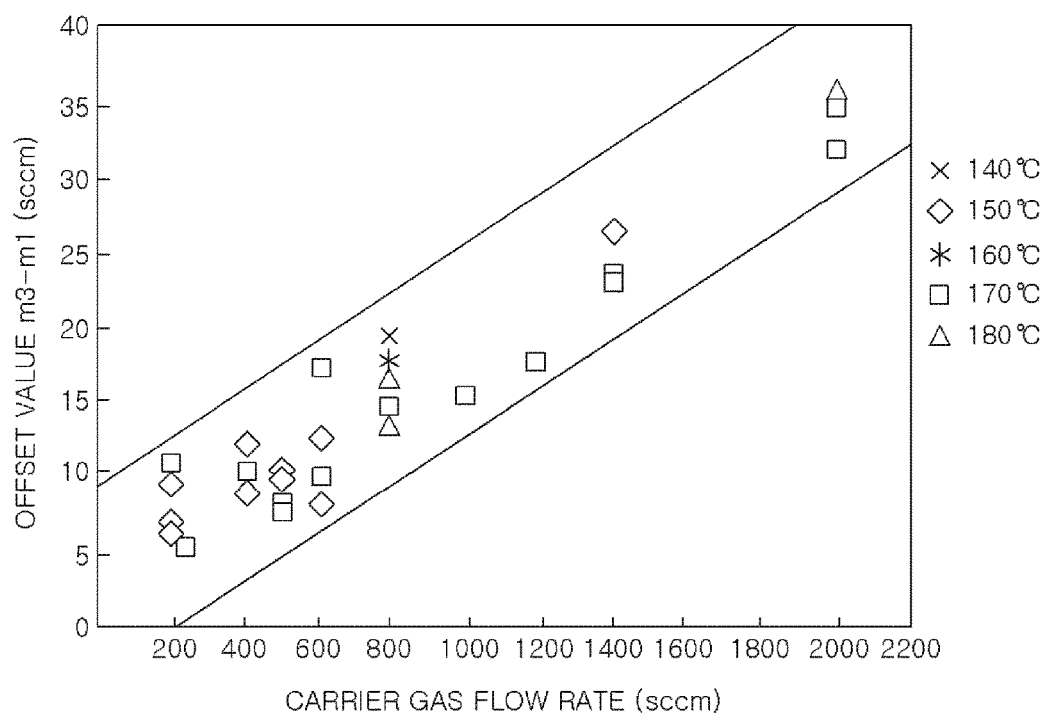
FIG. 13 is a characteristic diagram of a relationship between a flow rate of a carrier gas and an offset value.
Figure 14:
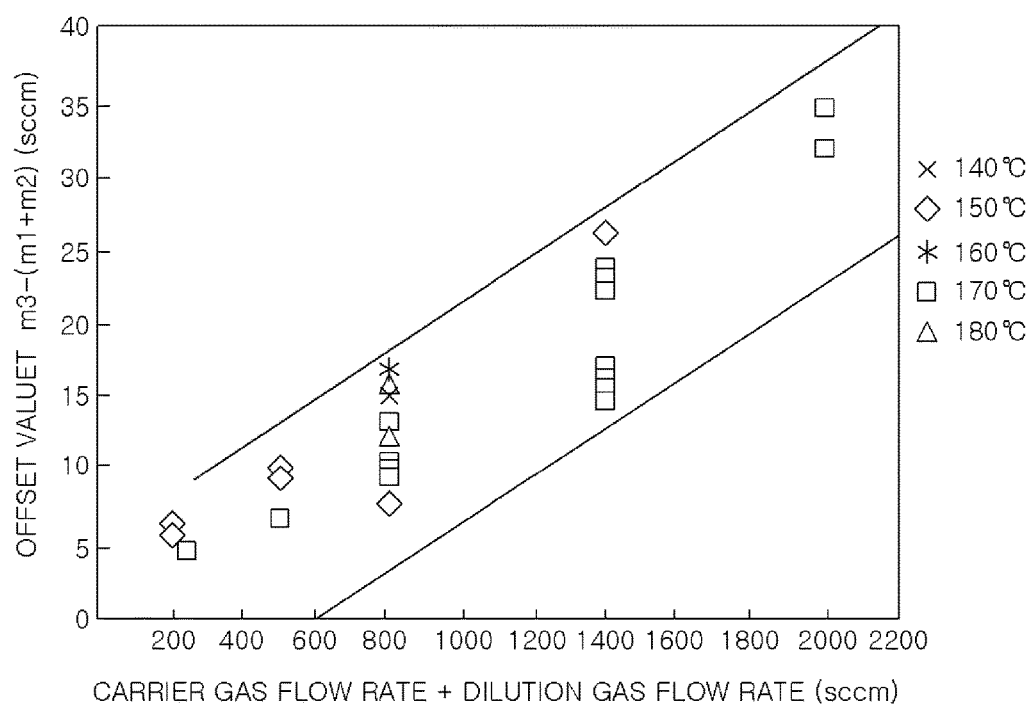
FIG. 14 is a characteristic diagram of a relationship between a total flow rate of a carrier gas and a dilution gas and an offset value.

FIG. 13 is a characteristic view showing a relationship between the offset value and the flow rate of the carrier gas in an example in which the offset value was obtained by using a processing recipe in which the flow rate of the dilution gas is set to zero. FIG. 14 is a characteristic view showing a relationship between the offset value and the total flow rate of the carrier gas and the dilution gas in an example in which the offset value was obtained by using a processing recipe in which the carrier gas and the dilution gas are supplied. In FIGS. 13 and 14, the relationship therebetween was obtained while varying the temperature of the film forming unit 40.

The result shows that the offset value tends to be increased by increasing the flow rates of the carrier gas and the dilution gas as can be seen from FIGS. 13 and 14. However, even when the flow rates of the carrier gas and the dilution gas are constant, the offset value has variation due to the set values of the processing recipe such as the temperature and the pressure of the film forming unit 40, the opening/closing cycle of the valve V1 and the like. Therefore, when the processing parameters are changed as described above, it is preferable to obtain the offset value by using the changed processing parameters.

While the present disclosure has been shown and described with respect to the embodiments, it will be understood by those skilled in the art that various changes and modifications may be made without departing from the scope of the present disclosure as defined in the following claims.

What is claimed is:

1. A raw material gas supply method for supplying a raw material gas obtained by vaporizing a solid or liquid raw material in a raw material container along with a carrier gas to a film forming unit for forming a film on a substrate by using a raw material gas supply apparatus including: a carrier gas supply line for supplying a carrier gas to the raw material container; a bypass channel branched from the carrier gas supply line and connected to the raw material gas supply line while bypassing the raw material container; a dilution gas supply line connected to the raw material gas supply line at a downstream side of a connection portion to which the bypass channel is connected, the dilution gas supply line serving to allow a dilution gas to join with the raw material gas; a first mass flow controller and a second mass flow controller connected to the carrier gas supply line and the dilution gas supply line, respectively; a mass flow meter provided in the raw material gas supply line at a downstream side of a joining portion to which the dilution gas supply line is connected; and a switching mechanism configured to selectively allow a carrier gas to flow through an inside of the raw material container or through the bypass channel, the method comprising:

obtaining an offset value that is a value of (m3−(m1+m2)), m1, m2 and m3 being respective measurement values of the first mass controller, the second mass flow controller and the mass flow meter, by supplying the carrier gas and the dilution gas in a state where the carrier gas flows through the bypass channel;

obtaining an actual measurement value of a flow rate of the raw material by subtracting the offset value from a value of (m3−(m1+m2)) obtained by supplying the carrier gas and dilution gas in a state where the carrier gas flows through the inside of the raw material container and calculating a difference between a target value of the flow rate of the raw material and the actual measurement value; and adjusting a set value of the first mass flow controller such that the flow rate of the raw material becomes the target value based on relationship between the difference, increase/decrease in the flow rate of the raw material, and increase/decrease in the flow rate of the carrier gas.

2. The raw material gas supply method of claim 1, wherein the film forming unit performs a film forming process by alternately supplying the raw material gas and a reactant gas that reacts with the raw material gas to the substrate and supplying a replacement gas between the supplying the raw material gas and the supplying the reactant gas, and the respective measurement values m1, m2 and m3 in said obtaining the value of (m3−(m1+m2)) by supplying the carrier gas and the dilution gas in a state where the carrier gas flows through the inside of the raw material container are obtained by dividing an integration value of the flow rate in n cycle or cycles of supplying the raw material gas and stopping the supply, n being an integer greater than or equal to 1, by a time period T of the cycle or cycles.

3. The raw material gas supply method of claim 2, wherein the respective measurement values m1, m2 and m3 in said obtaining the value of (m3−(m1+m2)) by supplying the carrier gas and the dilution gas in a state where the carrier gas flows through the bypass channel are obtained by dividing an integration value of the flow rate in the n cycle or cycles by the time period T.

4. The raw material gas supply method of claim 1, further comprising, before said obtaining the offset value, reading out from a processing recipe of a lot of the substrate parameters of the set value of the first mass flow controller, the set value of the second mass flow controller, a pressure of the film forming unit, and a cycle of supplying a gas to the film forming unit and stopping the supply; and supplying the carrier gas and the dilution gas in a state where the carrier gas flows through the bypass channel and generating a calculation recipe by recording the read-out parameters in a recipe format in which the number of the cycle is specified, wherein in said obtaining the offset value, the offset value is obtained by supplying the carrier gas and the dilution gas based on the calculation recipe.

\* \* \* \* \*